(12) United States Patent
Ridderbusch

(10) Patent No.: US 10,386,488 B2
(45) Date of Patent: *Aug. 20, 2019

(54) VEHICLE LIDAR SYSTEM

(71) Applicant: Robert Bosch GmbH, Stuttgart (DE)

(72) Inventor: Heiko Ridderbusch, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 371 days.

This patent is subject to a terminal disclaimer.

(21) Appl. No.: 15/311,588

(22) PCT Filed: May 26, 2015

(86) PCT No.: PCT/EP2015/061539
§ 371 (c)(1),
(2) Date: Nov. 16, 2016

(87) PCT Pub. No.: WO2015/189024
PCT Pub. Date: Dec. 17, 2015

(65) Prior Publication Data
US 2017/0090034 A1    Mar. 30, 2017

(30) Foreign Application Priority Data

Jun. 11, 2014    (DE) .................. 10 2014 211 073

(51) Int. Cl.
G01S 17/00    (2006.01)
G01S 17/93    (2006.01)
G01S 17/42    (2006.01)
G01S 7/481    (2006.01)
H01S 5/183    (2006.01)

(52) U.S. Cl.
CPC .......... G01S 17/936 (2013.01); G01S 7/4814 (2013.01); G01S 7/4817 (2013.01); G01S 17/42 (2013.01); H01S 5/183 (2013.01)

(58) Field of Classification Search
None
See application file for complete search history.

(56) References Cited

U.S. PATENT DOCUMENTS

2010/0328644 A1    12/2010    Lu et al.
2013/0206967 A1    8/2013    Shpunt et al.

FOREIGN PATENT DOCUMENTS

| CN | 103457158 A | 12/2013 |
| CN | 103760025 A | 4/2014 |
| DE | 102007004609 A1 | 8/2007 |
| DE | 102010005993 A1 | 7/2011 |

(Continued)

OTHER PUBLICATIONS

Princeton Optronics, Inc. Narrow Divergence VCSEL Array (60W) Part #NDVA-08-60-W0975, Jan. 1, 2009.

(Continued)

*Primary Examiner* — Hovhannes Baghdasaryan
(74) *Attorney, Agent, or Firm* — Norton Rose Fulbright US LLP; Gerard Messina

(57) ABSTRACT

A vehicle LIDAR system, including: a solid-state laser having a brightness of at least 100 kW/(mm² sr), which is designed to emit laser pulses having a wavelength of at least 900 nm and a maximum power per laser pulse of at least 50 W; at least one movably situated mirror for deflecting the laser pulses in the direction of objects to be detected; a receiver for detecting the laser pulses reflected by the objects.

19 Claims, 1 Drawing Sheet

(56) References Cited

FOREIGN PATENT DOCUMENTS

| | | |
|---|---|---|
| JP | H07280939 A | 10/1995 |
| JP | H10325872 A | 12/1998 |
| JP | 2010502228 A | 1/2010 |
| JP | 2010151958 A | 7/2010 |
| JP | 2011089986 A | 5/2011 |
| JP | 2012150049 A | 8/2012 |
| WO | 2013178429 A1 | 12/2013 |

OTHER PUBLICATIONS

International Search Report dated Aug. 28, 2015, of the corresponding International Application PCT/EP2015/061539 filed May 26, 2015.

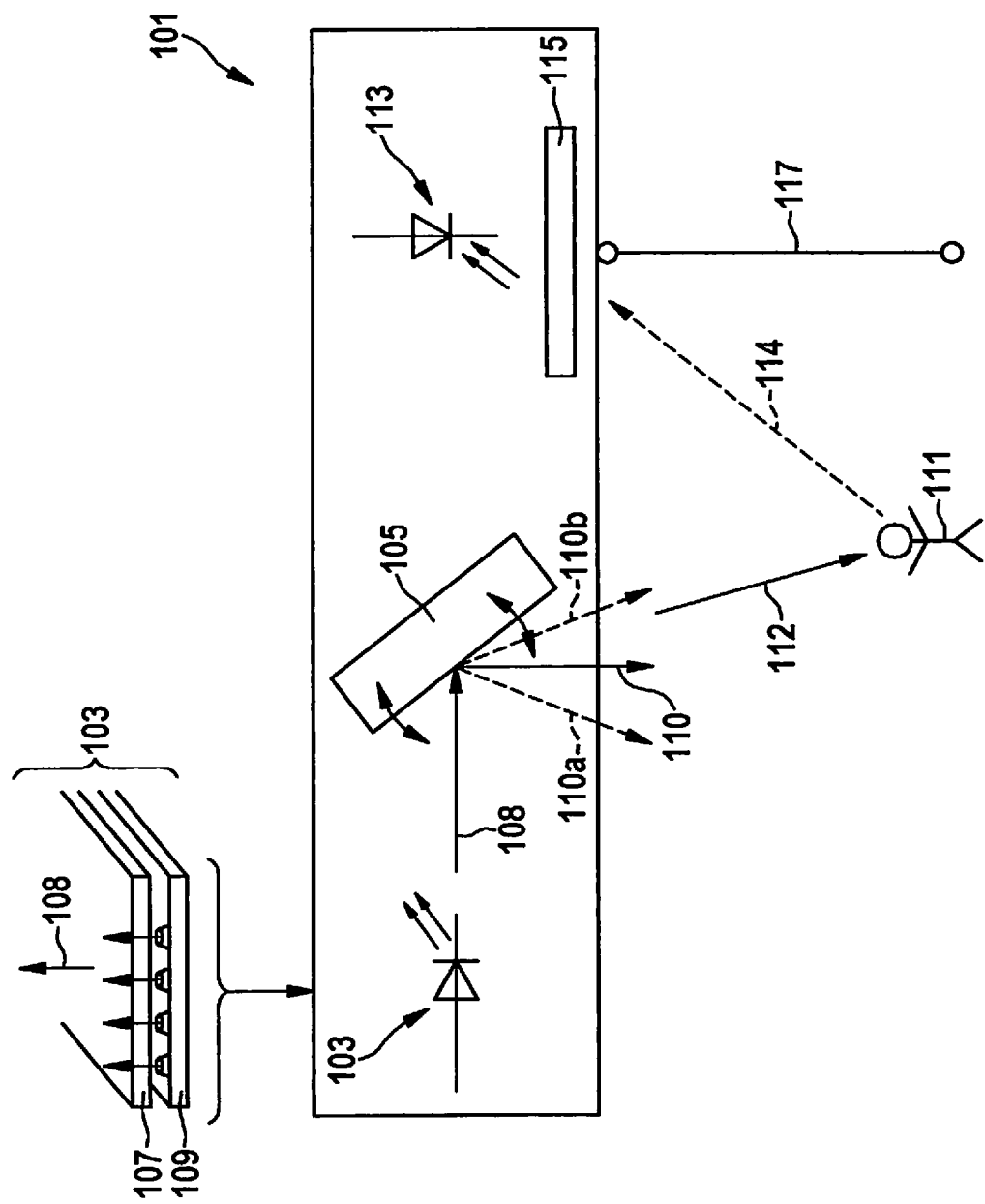

VEHICLE LIDAR SYSTEM

FIELD

The present invention relates to a vehicle LIDAR system and to a use of the vehicle LIDAR system.

BACKGROUND INFORMATION

A laser and optics system for use in vehicle-based LIDAR systems is described in German Patent Application No. DE 10 2007 004 609 A1. The system includes a semiconductor laser array and a suitable lens or other optics system. The system is operated in a way that it replaces LIDAR laser systems which use mechanically rotated or deflected reflective optics.

SUMMARY

It is an object of the present invention to provide a vehicle LIDAR system.

It is a further object of the present invention to provide a use of the vehicle LIDAR system.

Advantageous embodiments of the present invention are described herein.

According to one aspect of the present invention, a vehicle LIDAR system is provided, including:
- a solid-state laser having a brightness of at least 100 kW/(mm$^2$ sr), which is designed to emit laser pulses having a wavelength of at least 900 nm, preferably of at least 1000 nm, and a maximum power per laser pulse of at least 50 W;
- at least one movably situated mirror for deflecting the laser pulses in the direction of objects to be detected;
- a receiver for detecting the laser pulses reflected by the objects.

According to a further aspect, the vehicle LIDAR system is used for detecting objects in the surroundings of a vehicle. In particular, a time of flight measurement of the laser pulses is carried out with the aid of the vehicle LIDAR system, so that advantageously a distance measurement with respect to objects to be detected may be carried out.

According to another aspect, a vehicle including the vehicle LIDAR system is provided.

Using the solid-state laser having the above properties for the vehicle LIDAR system in particular yields the technical advantage that, within an eye safety guideline according to DIN 60825, a high range of up to 200 m, for example, and a resolution of <0.3°, for example, preferably <0.15°, are made possible. Furthermore, at wavelengths greater than 900 nm, in particular greater than 1000 nm, the strain for the human eye from the laser radiation is generally no longer as high, so that an eye-safe laser class 1 is advantageously achievable even at higher pulse powers and energies, which in turn increases a range of the system. Furthermore, at wavelengths greater than 900 nm, preferably greater than 1000 nm, an intensity of the solar radiation is approximately lower by a factor of 2, so that a signal-to-noise ratio of the vehicle LIDAR system improves. This compares to conventional laser systems for LIDAR systems, such as edge emitters, which emit at a wavelength of 850 nm to 950 nm.

Providing the movably situated mirror in particular yields the technical advantage that an illumination area, or an area illuminatable with the aid of the laser pulses, in which objects may be detected depends on a movability of the mirror and/or on a size of the mirror and, for example, no longer on a certain beam size of the solid-state laser. Accordingly, the solid-state laser may be dimensioned smaller. In particular, a beam diameter of the laser radiation may be dimensioned smaller. Furthermore, the solid-state laser may be installed in arbitrary positions in the vehicle. This is because the deflection of the emitted laser pulses in the direction of objects to be detected is effectuated with the aid of the mirror. This means that an installation site of the solid-state laser in the vehicle is independent of the desired area to be illuminated in the surroundings of the vehicle.

According to one specific embodiment, it is provided that the solid-state laser has a brightness of at least 1 MW/(mm$^2$ sr). The brightness of the solid-state laser preferably ranges between 100 kW/(mm$^2$ sr) and 1 MW/(mm$^2$ sr). In general, a higher brightness advantageously means a higher detection range of the vehicle LIDAR system. This means that also objects at distances from the solid-state laser of up to 200 m and more may advantageously be detected. The brightness may in particular be referred to as a beam quality. In optics and in laser technology, the brightness usually describes the bundling of a beam of electromagnetic radiation, here, of the laser beam.

According to one specific embodiment, it is provided that a maximum power per laser pulse is between 50 W and 100 W. Here too, a higher maximum power means a higher range. A maximum power per laser pulse means that it is also possible to emit laser pulses having a lower power. The maximum possible power per laser pulse accordingly is 50 W, 100 W, or a value between 50 W and 100 W.

According to one further specific embodiment, it is provided that the laser pulses have a duration of ≤100 ns, preferably of ≤50 ns, in particular of ≤10 ns, for example of ≤1 ns, in particular between 2 ns and 20 ns, preferably between 2 ns and 4 ns, for example 2.2 ns. In general, shorter pulse durations effectuate an improved accuracy or resolution with respect to a distance measurement.

According to one specific embodiment, it is provided that the solid-state laser is electrically and/or optically pumpable or excitable. This means that the solid-state laser is or may be electrically and/or optically pumped or excited.

In another specific embodiment it is provided that the solid-state laser is designed as a vertical cavity surface-emitting laser. The corresponding abbreviation is VCSEL. By providing such a vertical emitter, the above-described beam quality or brightness may advantageously be effectuated particularly easily compared to conventional edge emitters. This applies in particular also to ranges of the vehicle LIDAR system of >50 m, in particular up to 200 m at the above-described resolution of 1×1 m$^2$, for example, at 200 m. It is further advantageous that such a vertical emitter is more robust compared to conventional edge emitters. For example, it is not possible to destroy a VCSEL by an overcurrent, and thus an excessively high pulse power, at an outcoupling facet. Rather, a VCSEL at the most exhibits a thermal rollover. Such a thermal rollover does not result in destruction and is advantageously reversible. Furthermore, a VCSEL is producible and testable on a wafer level scale, so that manufacturing costs are scalable, in particular scalable similarly to high performance LEDs. During a thermal rollover, the laser material becomes hotter, whereby the efficiency decreases, as a result of which the material becomes even hotter. The laser extinguishes starting at a certain decrease in the efficiency. The LED and vertical emitters radiate the power upwardly. During manufacture, the radiation properties may still be tested if the entire wafer has not yet been separated. In contrast, an edge emitter radiates to the side, and testing is thus not possible. The wafer must therefore first be separated (cut) to test the laser.

A vertical emitter may thus be tested while it is still situated on the wafer, i.e., prior to separation. This is because it radiates upwardly.

Furthermore, it is advantageously particularly easy to generate or produce short pulses of <1 ns pulse rise time using such vertical emitters. This applies in particular to a higher duty cycle compared to conventional edge emitters. The duty cycle is understood to mean the ratio between "in operation, i.e., active" and "not in operation, i.e., not active." In one specific embodiment, a duty cycle of the solid-state laser is between 1% and 2%. Conventional edge emitters for the LIDAR application today partially achieve only less than 1% or less (e.g., OSRAM SPL PL90_3 having a duty cycle of up to 0.1%).

Furthermore, the brightness or beam quality according to the present invention is achievable with the aid of such a vertical emitter at output wavelengths (i.e., wavelengths of the laser pulses) of greater than 900 nm, in particular greater than 1000 nm, preferably at 1050 nm to 1100 nm.

A solid-state laser within the context of the present invention in particular includes a laser-active material, which is incorporated in a crystal lattice or another host material. Examples of such solid-state lasers are: neodymium- or ytterbium-doped yttrium aluminum garnet (Nd: YAG, YB:YAG). Furthermore, according to other specific embodiments, the solid-state laser may also be a semiconductor laser. For example, the semiconductor laser may be an aluminum gallium arsenide laser. This emits laser radiation having a wavelength of up to 1100 nm. For example, a semiconductor laser may include an indium- or a phosphate-doped laser-active material. Such a semiconductor laser emits laser radiation in the wavelength range of >1000 nm.

In a further specific embodiment, it is provided that the mirror is movable in two different directions. This in particular yields the technical advantage that an illumination area or the illuminatable area may be spanned by these two directions, within which objects may be detected. In particular, the two directions are oriented perpendicularly to each other. Preferably, only one mirror is provided, which is movable in two different directions.

According to another specific embodiment, it is provided that two mirrors are provided, which are each movable in a different direction. This means that each of the mirrors may be moved in a different direction. Once again, an illumination area or an illuminatable area is spanned, within which the objects may be detected. Since two mirrors are provided here, which each may be moved independently of one another in different directions, a particularly rapid detection of objects is possible. Once again, the two directions are preferably oriented perpendicularly to each other. Preferably, only two mirrors are provided. Preferably, each of the two mirrors is movable only in one direction, these two directions being different, in particular oriented perpendicular to each other.

According to one specific embodiment, multiple mirrors are provided, which in particular are designed to be the same or different, for example. Specific embodiments with respect to multiple mirrors are derived analogously from specific embodiments with respect to one mirror and vice versa. Explanations, features and descriptions in connection with one mirror apply analogously to multiple mirrors, and vice versa. This means that when the singular is used for mirrors, the plural shall always be implied, and vice versa.

In one specific embodiment, it is provided that the mirror is movable magnetically and/or piezoelectrically. Such a magnetic and/or piezoelectric movability provides a particularly good accuracy and speed during moving.

According to one specific embodiment, it is provided that a diameter of the mirror is greater than or equal to 1 mm, in particular greater than or equal to 3 mm, for example equal to 3.5 mm, for example between 1 mm and 8 mm, in particular between 3 mm and 5 mm. The larger the mirror, the lower is the requirement in regard to the laser (the brightness, for example). The larger the mirror, the more light may be transported via the mirror (at a constant value of the brightness).

In another specific embodiment, it is provided that the mirror is movable across at least an angle of 20°, in particular 30°. In particular, it is provided that the mirror is movable across at least +/−10°, preferably +/−15°, relative to a center position. The movability of the mirror generally corresponds to the illuminatable area with the aid of the laser radiation. This means, the greater the movability, the greater is the illuminatable area.

In another specific embodiment, it is provided that the mirror has a reflectivity of at least 80%, in particular of at least 90%, preferably of at least 95%, in particular of at least 99%. The higher the reflectivity of the mirror, the higher generally is an efficiency of the vehicle LIDAR system. Losses of laser radiation may thus advantageously be minimized. The reflectivity refers in particular to the laser wavelength, i.e., to the wavelength of the laser pulses. This means that the above reflectivities are preferably achieved at least at the laser wavelength.

Such a reflectivity may be effectuated, for example, in that the mirror is coated according to one specific embodiment, i.e., includes a coating, in particular an optical coating. Such a coating may be a metal coating, for example. In particular, metal may be vapor-deposited onto a mirror substrate to form such a coating. The mirror is in particular coated with a metal, i.e., includes a metal layer, in particular a vapor-deposited metal layer. A metal may be, for example, gold, silver, or aluminum. For example, a combination of the above-mentioned metals may be vapor-deposited onto the mirror substrate. This means that the coating may include gold, silver, aluminum and/or any arbitrary combination thereof. As an alternative or in addition, the coating may include one or multiple dielectric layers. Such dielectric layers preferably include a high refractive material and a low refractive material. In this way, an even higher reflectivity may advantageously be effectuated. A layer thickness of the coating may be maximally 1 μm, for example. The following layer materials may be used, for example, for dielectric layers: magnesium fluoride, silicon dioxide, aluminum oxide, zirconium dioxide, praseodymium-titanium oxide, titanium oxide or zinc sulfide or a combination thereof. In particular, the coating may include multiple layers, which in particular are designed to be the same or preferably different. In particular, the coating may be designed as a dichroic mirror. Such a mirror is a wavelength-selective mirror and allows only a certain wavelength range to pass. According to one specific embodiment, such a wavelength range may be 900 nm to 1200 nm. In particular, a layer thickness of the coating may be less than 50 nm. In particular, layer thicknesses of the coating of 100 nm, in particular of several 100 nm, for example of up to 200 nm, may be provided.

In another specific embodiment, it is provided that the mirror is designed as a microelectromechanical mirror. This means that the microelectromechanical mirror is designed as a microelectromechanical element.

According to another specific embodiment, it is provided that an evaluation device is formed, which is designed to determine a distance from a detected object based on the detected laser pulses. This takes place in particular with the aid of a time of flight measurement of the laser pulses.

According to one specific embodiment, the vehicle LIDAR system is used to detect objects in the surroundings of the vehicle. In particular, a time of flight measurement of the laser pulses is carried out. This means that the solid-state laser emits laser pulses. If these laser pulses impinge on objects, they are reflected by these. This takes place at least partially in the direction of the receiver, which may also be referred to as a detector. Based on time of flight measurements of the laser pulses, it is then possible to determine a distance between the object and the vehicle LIDAR system in a conventional manner.

In one further specific embodiment, it is provided that the receiver includes a CMOS-compatible image sensor for detecting the reflected laser pulses and for recording an image of an area illuminatable with the aid of the deflected laser pulses. This specific embodiment thus in particular includes the idea of providing a receiver (which may also be referred to as a detector) for detecting the laser pulses reflected by the objects, the receiver including a CMOS-compatible image sensor, which is able to both detect the reflected laser pulses and record an image of an area illuminatable with the aid of the deflected laser pulses. The CMOS-compatible image sensor according to the present invention thus has a dual function: detecting the reflected laser pulses and recording an image. Thus, only a single sensor is necessary to provide both a LIDAR function (in particular for a distance measurement) and an image detection function. Contrary to this, conventionally, two sensors are necessary so that the above-mentioned functions may be effectuated or provided. Compared to the conventional systems, the vehicle LIDAR system according to the present invention is thus smaller and more compact and may thus be installed in a smaller installation space.

According to one specific embodiment, the CMOS-compatible image sensor is a CMOS image sensor.

In a CMOS image sensor, the CMOS process may be used without alteration and/or modification. The CMOS basic process is to be used in a CMOS compatible image sensor, but changes to the process (modification, new process step, and the like) are possible. This means that the CMOS image sensor is produced in the CMOS process. The CMOS compatible image sensor was at least partially produced in the CMOS process, i.e., based on the CMOS production process, changes and/or innovations in the production of the CMOS compatible image sensor having been carried out in comparison with to the CMOS production process.

According to one specific embodiment, it is provided that the CMOS compatible image sensor includes multiple pixels, and an evaluation electronics being provided, which is designed to read out signals of the pixels of the CMOS compatible image sensor and ascertain a distance from a detected object based on the read-out signals. This in particular yields the technical advantage that a corresponding time of flight measurement of the laser pulses may be carried out for each pixel. This means that each pixel signal per se may be used to ascertain the distance from a detected object. In particular, it is provided that a group of pixels is read out, the read-out signals of the group of these pixels being used to ascertain a distance from a detected object. In this way, a so-called time of flight (TOF) measurement is advantageously carried out.

In another specific embodiment, it is provided that an optical element for mapping the illuminatable area onto the CMOS compatible image sensor is provided. This in particular yields the technical advantage that the illuminatable area may be optimally mapped onto the CMOS compatible image sensor so that the CMOS compatible image sensor is able to detect the entire illuminatable area, and thus is also able to detect objects situated in this illuminatable area. For example, the optical element is a lens or a mirror, such as a parabolic mirror. Preferably multiple optical elements are provided, which in particular are designed to be the same or different.

According to another specific embodiment, it is provided that the optical element has a transmission of at least 95%, preferably >99%, for a wavelength range which corresponds to the laser wavelength plus minus ≤20 nm, preferably plus minus ≤10 nm, the transmission for wavelengths outside the wavelength range being less than 50%, preferably less than 20%. This in particular yields the technical advantage that a signal-to-noise ratio may be increased.

In another specific embodiment, it is provided that the CMOS compatible image sensor is designed to detect electromagnetic radiation having a wavelength of at least 900 nm, preferably of at least 1000 nm. This in particular yields the technical advantage that the CMOS compatible image sensor is also able to detect laser pulses which have a wavelength of at least 900 nm. In this wavelength range of greater than 900 nm, the sensitivity with respect to damage to the eye due to this electromagnetic radiation is usually reduced, so that the use of the vehicle LIDAR system generally does not pose a risk to road users in the surroundings of the vehicle.

In another specific embodiment, it is provided that the CMOS compatible image sensor includes doped and/or surface-modified silicon as sensor material. This in particular yields the technical advantage that such a silicon is more sensitive to wavelengths greater than 1000 nm, compared to undoped or not surface-modified silicon. Such silicon is known, for example, as black silicon or as pink silicon. Sulfur may be provided as the dopant, for example.

In the case of a surface modification, a reflectivity is drastically reduced by a refractive index step from air to silicon, so that more incoming photons may penetrate into the image sensor and then be appropriately detected. The surface modification is carried out, for example, with the aid of structuring using short laser pulses. For example, these laser pulses have a pulse duration of ≤10 ns, for example of ≤1 ns. For example, a surface modification may be carried out with the aid of a coating. This means that the silicon is coated.

Doping the silicon in particular yields the technical effect that an absorption probability for photons is thus increased, so that a sensitivity of the detector is also increased at longer wavelengths.

The present invention is described in greater detail below based on preferred exemplary embodiments.

BRIEF DESCRIPTION OF THE DRAWING

FIG. 1 shows a vehicle LIDAR system.

DETAILED DESCRIPTION OF EXAMPLE EMBODIMENTS

FIG. 1 shows a vehicle LIDAR system 101.

System 101 includes a solid-state laser 103, which is designed as a vertical cavity surface-emitting laser (VCSEL). Reference numeral 103 points to a graphical symbol with the aid of an arrow, which symbolically represents the solid-state laser. Reference numeral 103 furthermore indicates a curly bracket, which shows a more detailed configuration of the vertical cavity surface-emitting laser. VCSEL 103 may emit laser pulses with appropriate excitation.

System 101 furthermore includes a mirror 105, which is designed as a microelectromechanical element. Such a mirror may also be referred to as a MEMS mirror. Mirror 105 is movably situated. Mirror 105 deflects the laser pulses of solid-state laser 103 in the direction of objects to be detected. Such an object is denoted by reference numeral 111 here by way of example. Due to the movability of mirror 105, an illuminatable area may be formed with the aid of the deflected laser pulses. Such an illuminatable area is also referred to as a "field of view." When objects, object 111 here as an example, are present within the illuminatable area, these may be detected with the aid of the vehicle LIDAR system.

Solid-state laser 103 includes a vertical emitter 109 having a cavity 107 from which laser pulses are coupled out. The coupled-out laser pulses are denoted only symbolically by reference numeral 108 with the aid of an arrow.

When mirror 105 is in its center position, the laser radiation reflected by mirror 105 is denoted by reference numeral 110 using a solid arrow. When mirror 105 is in its maximum possible moved position, the reflected laser radiation is denoted by reference numerals 110a and 110b with the aid of two dotted arrows. Laser radiation (i.e., the laser pulses), which is deflected onto object 111 with the aid of mirror 105, is denoted by reference numeral 112 using a solid arrow. From there, i.e., from object 111, the laser radiation, i.e., the laser pulses, is reflected in the direction of a receiver or detector 113 of system 101. This reflected laser radiation is symbolically denoted by reference numeral 114 with the aid of a dotted arrow. Relative to the propagation direction of laser radiation 114, a filter 115 is provided in front of detector or receiver 113 so that only electromagnetic radiation having a wavelength corresponding to the filter is allowed to pass to receiver 113. Filter 115 is pervious to a wavelength range of plus minus ≤20 nm, preferably plus minus ≤10 nm, around the laser wavelength, and pervious to the further wavelengths (i.e., not the laser wavelength, including the above-described plus minus ranges) at <50%, preferably <20%.

Receiver 113 is also symbolically represented with the aid of a graphical symbol, analogously to solid-state laser 103. Receiver 113 may include an indium gallium arsenide sensor, for example, or a PIN diode, or an avalanche photodiode. "PIN" denotes "positive intrinsic negative diode."

In this way, a time of flight measurement of the laser pulses is advantageously made possible, so that a distance 117 between object 111 and system 101 may be ascertained or determined.

Vertical cavity surface-emitting laser 103 has a brightness of at least 100 kW/(mm$^2$ sr) and emits laser pulses having a wavelength of at least 900 nm, preferably between 1000 nm and 1100 nm. Furthermore, a maximum power per laser pulse is at least 50 W, preferably between 50 W and 100 W, in particular 100 W. Such high beam qualities or brightnesses may be achieved or effectuated as follows, for example.

For example, it is provided that the resonator length (cavity) is increased. In this way, fewer transversal modes may oscillate, which has a positive influence on the beam quality or brightness. In addition to or instead of extending the cavity, preferably a double cavity is provided. Not only one output mirror is used for the resonator, but two, in the case of such a double cavity. The inner mirror of the double cavity preferably has a lower reflectivity for the laser wavelength compared to the outer output mirror of the double cavity. Even with such a double cavity, the oscillation of higher transversal modes is made more difficult by an appropriate design of this double cavity, which advantageously increases the beam quality or brightness. The double cavity is generally referred to as a "coupled cavity."

What is claimed is:

1. A vehicle LIDAR system, comprising:
   a solid-state laser having a brightness of at least 100 kW/(mm$^2$ sr), which is designed to emit laser pulses having a wavelength of at least 900 nm and a maximum power per laser pulse of at least 50 W;
   at least one movably situated mirror to deflect the laser pulses in a direction of an object to be detected; and
   a receiver to detect the laser pulses reflected by the object.

2. The vehicle LIDAR system as recited in claim 1, wherein the solid-state laser is designed as a vertical cavity surface-emitting laser.

3. The vehicle LIDAR system as recited in claim 1, wherein the mirror is movable in two different directions.

4. The vehicle LIDAR system as recited in claim 1, wherein the at least one mirror includes two mirrors, which are each movable in a different direction.

5. The vehicle LIDAR system as recited in claim 1, wherein the mirror is movable at least one of magnetically and piezoelectrically.

6. The vehicle LIDAR system as recited in claim 1, wherein a diameter of the mirror is greater than or equal to 1 mm.

7. The vehicle LIDAR system as recited in claim 1, wherein a diameter of the mirror is greater than or equal to 3 mm.

8. The vehicle LIDAR system as recited in claim 1, wherein the mirror is movable across at least an angle of 20°.

9. The vehicle LIDAR system as recited in claim 1, wherein the mirror is movable across at least an angle of 30°.

10. The vehicle LIDAR system as recited in claim 1, wherein the mirror has a reflectivity of at least 80%.

11. The vehicle LIDAR system as recited in claim 1, wherein the mirror has a reflectivity of at least 90%.

12. The vehicle LIDAR system as recited in claim 1, wherein the mirror is a microelectromechanical mirror.

13. A vehicle LIDAR system for detecting objects in surroundings of a vehicle, the vehicle LIDAR system comprising:
    a solid-state laser having a brightness of at least 100 kW/(mm$^2$ sr), which is designed to emit laser pulses having a wavelength of at least 900 nm and a maximum power per laser pulse of at least 50 W;
    at least one movably situated mirror to deflect the laser pulses in a direction of an object to be detected, the object being in the surroundings of the vehicle; and
    a receiver to detect the laser pulses reflected by the object.

14. The vehicle LIDAR system as recited in claim 1, wherein a diameter of the mirror is between 3 mm and 5 mm.

15. The vehicle LIDAR as recited in claim 13, wherein a diameter of the mirror is between 3 mm and 5 mm.

16. The vehicle LIDAR system as recited in claim 1, wherein a duty cycle of the laser pulses emitted by the solid-state laser is between 1% and 2%.

17. The vehicle LIDAR system as recited in claim 13, wherein a duty cycle of the laser pulses emitted by the solid-state laser is between 1% and 2%.

18. The vehicle LIDAR system as recited in claim 1, wherein the laser pulses emitted by the solid-state laser each has a pulse duration of less than 1 ns.

19. The vehicle LIDAR system as recited in claim 13, wherein the laser pulses emitted by the solid-state laser each has a pulse duration of less than 1 ns.

* * * * *